United States Patent
Marsh

(10) Patent No.: US 8,148,197 B2
(45) Date of Patent: Apr. 3, 2012

(54) METHODS OF FORMING GERMANIUM-ANTIMONY-TELLURIUM MATERIALS AND A METHOD OF FORMING A SEMICONDUCTOR DEVICE STRUCTURE INCLUDING THE SAME

(75) Inventor: Eugene P. Marsh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 52 days.

(21) Appl. No.: 12/844,595

(22) Filed: Jul. 27, 2010

(65) Prior Publication Data
US 2012/0028410 A1    Feb. 2, 2012

(51) Int. Cl.
*H01L 21/00* (2006.01)
(52) U.S. Cl. ............. 438/102; 438/778; 427/255.29
(58) Field of Classification Search ............ 438/102, 438/778; 427/255.29
See application file for complete search history.

(56) References Cited

U.S. PATENT DOCUMENTS

| | | | | |
|---|---|---|---|---|
| 6,815,350 | B2 * | 11/2004 | Kim et al. | 438/680 |
| 7,838,329 | B2 * | 11/2010 | Hunks et al. | 438/102 |
| 7,902,048 | B2 * | 3/2011 | Shin et al. | 438/483 |
| 7,960,205 | B2 * | 6/2011 | Xiao et al. | 438/95 |
| 2006/0138393 | A1 * | 6/2006 | Seo et al. | 257/2 |
| 2008/0090326 | A1 * | 4/2008 | Shin et al. | 438/102 |
| 2009/0074652 | A1 | 3/2009 | Dussarrat | |
| 2009/0112009 | A1 | 4/2009 | Chen et al. | |
| 2009/0124039 | A1 * | 5/2009 | Roeder et al. | 438/99 |
| 2009/0137100 | A1 | 5/2009 | Xiao et al. | |
| 2009/0162973 | A1 | 6/2009 | Gatineau et al. | |
| 2009/0191330 | A1 | 7/2009 | Xiao | |
| 2009/0215225 | A1 | 8/2009 | Stender et al. | |
| 2009/0280052 | A1 | 11/2009 | Xiao et al. | |
| 2009/0305458 | A1 | 12/2009 | Hunks et al. | |
| 2010/0317150 | A1 * | 12/2010 | Hunks et al. | 438/102 |
| 2011/0263100 | A1 * | 10/2011 | Hunks et al. | 438/478 |

OTHER PUBLICATIONS

Choi et al., Cyclic Plasma-Enhanced Chemical Vapor Deposition of Ge2Sb2Te5 Films Using Metal-Organic Sources for Phase Change RAM, 210th ECS Meeting, Oct. 29-Nov. 3, 2006, Abstract #1109, 1 page.

Reifenberg et al., Thickness and Stoichiometry Dependence of the Thermal Conductivity of GeSbTe Films, Applied Physics Letters (2007), vol. 91, pp. 111904-1-111904-3.

Ritala et al., Atomic Layer Deposition of Germanium Antimony Telluride Thin Films, 2009, European Symposium on Phase Change and Ovonic Science, Sep. 6-8, 2009, pp. 151-156.

* cited by examiner

*Primary Examiner* — Richard A. Booth
(74) *Attorney, Agent, or Firm* — TraskBritt

(57) ABSTRACT

A method of forming a material. The method comprises conducting an ALD layer cycle of a first metal, the ALD layer cycle comprising a reactive first metal precursor and a co-reactive first metal precursor. An ALD layer cycle of a second metal is conducted, the ALD layer cycle comprising a reactive second metal precursor and a co-reactive second metal precursor. An ALD layer cycle of a third metal is conducted, the ALD layer cycle comprising a reactive third metal precursor and a co-reactive third metal precursor. The ALD layer cycles of the first metal, the second metal, and the third metal are repeated to form a material, such as a GeSbTe material, having a desired stoichiometry. Additional methods of forming a material, such as a GeSbTe material, are disclosed, as is a method of forming a semiconductor device structure including a GeSbTe material.

18 Claims, 1 Drawing Sheet

METHODS OF FORMING GERMANIUM-ANTIMONY-TELLURIUM MATERIALS AND A METHOD OF FORMING A SEMICONDUCTOR DEVICE STRUCTURE INCLUDING THE SAME

TECHNICAL FIELD

Embodiments of the present invention relate to methods of forming a germanium-antimony-tellurium (GeSbTe) material by atomic layer deposition (ALD) and to a method of forming a semiconductor device structure including the GeSbTe material.

BACKGROUND

Phase change materials are known in the art for use in phase change memory. One common phase change material is $Ge_2Sb_2Te_5$, which is deposited by physical vapor deposition (PVD), chemical vapor deposition (CVD) or ALD. One disadvantage of PVD processes is that the process is not useful to deposit $Ge_2Sb_2Te_5$ in small structures, such as small vias or openings, which are becoming more commonplace as the size of semiconductor devices decreases.

Conventional ALD processes are well-suited for depositing highly conformal layers of GeSbTe materials in small openings or vias. However, compositions of GeSbTe materials that are capable of being deposited by these ALD processes are limited in the ratio of elements that can be present due to the chemistries of Ge, Sb, and Te. The stoichiometry of the GeSbTe material is fixed based on the precursors used. Only GeSbTe materials having compositions that fall on the GeTe or $GeTe_2$ and $Sb_2Te_3$ tie-lines for GeSbTe materials are possible by conventional ALD processes. While various precursors for ALD of GeSbTe materials are known, one problem with conventional ALD processes is that the composition of the resulting GeSbTe material is limited by the mechanisms of the ligand exchange reaction. For instance, if Ge(II)$Cl_2$ and Te(II)$(TMS)_2$ are used as precursors, GeTe is the predominant material formed by ALD. If Ge(IV)$Cl_4$ and Te(II)$(TMS)_2$ are used as the precursors, $GeTe_2$ is the predominant material formed by ALD. If Ge(IV)$(OEt)_4$ and Te(II)$(TMS)_2$ are used as the precursors, $GeTe_2$ is the predominant material formed by ALD. If Sb(III)$(OEt)_3$ and Te(II)$(TMS)_2$ are used as the precursors, $Sb_2Te_3$ is the predominant material formed by ALD. If Sb(III)$Cl_3$ and Te(II)$(TMS)_2$ are used as the precursors, $Sb_2Te_3$ is the predominant material formed by ALD. Other stoichiometries of the metals relative to one another are not possible.

As the size of semiconductor devices continue to decrease, it would be desirable to be able to deposit GeSbTe materials in small vias or openings by ALD. In addition, it would be desirable to have an ALD process that is capable of producing GeSbTe materials of other stoichiometries, such as stoichiometries that are off the composition tie-line.

DETAILED DESCRIPTION

Figure 1:
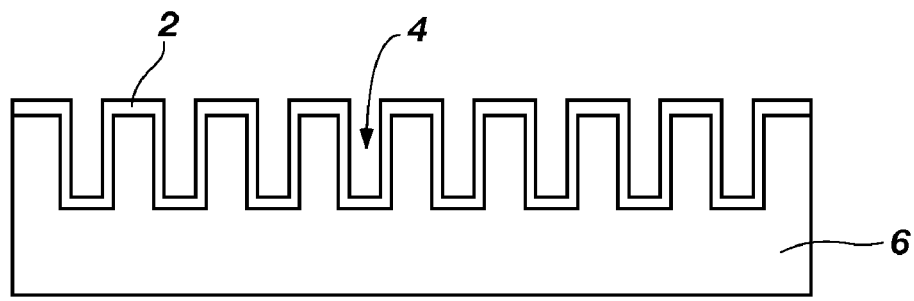
FIG. 1 is a cross-sectional view of a portion of a semiconductor device structure during fabrication thereof in accordance with an embodiment of the present invention.

Methods of forming GeSbTe materials having a desired stoichiometry or ratio of elements by an ALD process, a method of forming a semiconductor device structure including the GeSbTe materials, and GeSbTe materials having the desired stoichiometry are disclosed. As used herein, the term "GeSbTe material" means and includes a material having a chemical composition according to the following formula: $Ge_xSb_{100-(x+y)}Te_y$, where the stoichiometry (in atomic percent) of Ge and Te are indicated by x and y, respectively, and the remainder of the GeSbTe material is Sb. In the formula, x is greater than approximately 5 atomic percent but less than approximately 60 atomic percent, such as between approximately 17 atomic percent and approximately 44 atomic percent, and y is greater than approximately 20 atomic percent but less than approximately 85 atomic percent, such as between approximately 23 atomic percent and approximately 56 atomic percent. The GeSbTe material is a compound of germanium, antimony, and tellurium.

The following description provides specific details, such as material types, material thicknesses, and processing conditions in order to provide a thorough description of embodiments of the present invention. However, a person of ordinary skill in the art would understand that the embodiments of the present invention may be practiced without employing these specific details. Indeed, the embodiments of the present invention may be practiced in conjunction with conventional fabrication techniques employed in the industry. In addition, the description provided below does not form a complete process flow for manufacturing a semiconductor device, such as a PCRAM device. The semiconductor device structure described below does not form a complete semiconductor device. Only those process steps and structures necessary to understand the embodiments of the present invention are described in detail below. Additional steps to form the complete semiconductor device from the semiconductor device structure may be performed by conventional fabrication techniques.

To form each germanium layer, antimony layer, or tellurium layer of the GeSbTe material, a plurality of germanium precursors, antimony precursors, or tellurium precursors may be utilized in a single ALD layer cycle. As used herein, the term "ALD layer cycle" means and includes a portion of the ALD process during which a saturated layer of a metal is formed, which layer may be less than a monolayer of the material. A plurality of ALD layer cycles is conducted to form the desired GeSbTe material. For simplicity, the term "metal" is used herein to refer to at least one of germanium, antimony, or tellurium, while the terms "germanium," "antimony," and "tellurium" are used to refer to the specific metals. For simplicity, the term "metal precursor(s)" is used herein to collectively refer to at least one of the germanium precursor(s), antimony precursor(s), or tellurium precursor(s), while the terms "germanium precursor(s)," "antimony precursor(s)," and "tellurium precursor(s)" refer to precursor(s) of the specific metal. The germanium precursor(s), antimony precursor(s), or tellurium precursor(s) may function as a source of germanium, antimony, or tellurium, respectively.

In each ALD layer cycle, a reactive metal precursor may be reacted directly with a co-reactive metal precursor. Each of the metal precursors includes a metal and at least one ligand coordinated to the metal, with the metal in each of the metal precursors being the same. In other words, the metal precursors used in a particular ALD layer cycle may differ in the ligands, which provide the desired degree of reactivity to the metal precursors, but have the same metal center. The number of ligands coordinated to the metal is dependent on the valence state of the metal and may be determined by a person of ordinary skill in the art. For simplicity, the term "ligand" is used herein even if multiple ligands are coordinated to the metal. Each of the ligands coordinated to the metal may be selected depending on the desired reactivity of the metal precursor. As used herein, the terms "reactive metal precursor" and "co-reactive metal precursor" are used to differentiate between the metal precursors and do not indicate relative reactivities of the metal precursors utilized in a particular ALD layer cycle.

The two metal precursors used in a particular ALD layer cycle may have the following general structure M-(L1)$_n$ and M-(L2)$_n$, where M is the metal (germanium, antimony, or tellurium), L1 and L2 are ligands, and n is the number of ligands coordinated to the metal, which is dependent on the valence state of the metal and is an integer greater than or equal to 2. Each of the ligands coordinated to the metal may be the same or may be different so long as the desired reactivity of the metal precursor is achieved. As a result, the metal precursor may be symmetric or asymmetric. The metal precursors used in a particular ALD layer cycle may be able to participate in efficient ligand exchange reactions with one another. The metal precursors may also have sufficient reactivity, thermal stability, and volatility to be used in the ALD process. The metal precursors may be solids, liquids, or gases at room temperature (from approximately 20° C. to approximately 25° C.).

By way of example, during an ALD layer cycle to deposit a germanium monolayer on a substrate, two germanium precursors may be utilized, with one of the germanium precursors being a reactive germanium precursor and the other being a co-reactive germanium precursor. Since the germanium has a valence state of +2 or +4, two ligands or four ligands may be coordinated to the germanium. Thus, the formation of the germanium layer during the ALD layer cycle may utilize two germanium precursors having a common metal center but different ligands.

Reactive ligands that may be used include, but are not limited to, a halide group or an alkoxide group. By way of example, the reactive ligand may be a fluoride group, a chloride group, a bromide group, an iodide group, or combinations thereof. Metal halides that may be used as the reactive metal precursor include, but are not limited to, Ge(II)F$_2$, Ge(IV)F$_4$, Ge(II)Cl$_2$, Ge(IV)Cl$_4$, Ge(II)Br$_2$, Ge(IV)Br$_4$, Ge(IV)I$_4$, Sb(V)F$_5$, Sb(III)F$_3$, Sb(III)Cl$_3$, Sb(V)Cl$_5$, Sb(III)Br$_3$, TeCl$_4$, TeBr$_4$, or TeI$_4$. Such metal halides are commercially available from numerous sources, such as from Sigma-Aldrich Co. (St. Louis, Mo.). While each of the above examples includes a single type of halide group as the ligand, a metal halide having at least two different halide groups may be used. The alkoxide group of the reactive ligand may include an alkyl group having from one carbon atom to eight carbon atoms, including straight or branched carbon chains. By way of example, the alkoxide group may be a methoxy group (OMe), an ethoxy group (OEt), an iso-propoxy group, an n-propoxy group, an iso-butoxy group, an n-butoxy group, a sec-butoxy group, a t-butoxy group, a pentoxy group, a hexoxy group, a heptoxy group, an octoxy group, or combinations thereof. The alkoxide may also include heteroatoms, such as oxygen, nitrogen, or sulfur. Metal alkoxides that may be used as the reactive metal precursor include, but are not limited to, germanium(IV) methoxide (Ge(OMe)$_4$), germanium(IV) ethoxide (Ge(OEt)$_4$), antimony(III) methoxide (Sb(OMe)$_3$), antimony(III) ethoxide (Sb(OEt)$_3$), tellurium(IV) methoxide (Te(OMe)$_4$), or tellurium(IV) ethoxide (Te(OEt)$_4$). Such metal alkoxides are commercially available from numerous sources, such as from Sigma-Aldrich Co. (St. Louis, Mo.). While each of the above examples includes a single type of alkoxide group as the ligand, a metal alkoxide having at least two different alkoxide groups may be used.

The co-reactive ligand coordinated to the metal may be a substituted silyl group. The substituents on the silicon atom of the substituted silyl group may include a hydrogen atom, an alkyl group, an alkenyl group, a halogen atom, or combinations thereof. The alkyl group and alkenyl group may have from one carbon atom to four carbon atoms and may include straight or branched carbon chains. By way of example, the silicon atom may be substituted with trimethyl groups, forming a trimethylsilyl (TMS) group. The substituted silyl group may also include heteroatoms, such as oxygen, nitrogen, or sulfur. Metal silyl compounds that may be used as the co-reactive metal precursor include, but are not limited to, a disilylgermanium compound, a silylalkylgermanium compound, a tetrasilylgermanium compound, a trisilylalkylgermanium compound, a trisilylgermanium hydride compound, a silyltrialkylgermane compound, a disilyldialkylgermanium compound, a silyltrialkylgermanium compound, a trisilylantimony compound, a disilylalkylantimony compound, a dialkylsilylantimony compound, a disilylaminoantimony compound, a disilyltellurium compound, a silylalkyltellurium compound, or a silylaminotellurium compound. By way of example, the metal silyl compound may be Ge(II)(TMS)$_2$, Ge(IV)(TMS)$_4$, GeH(TMS)$_3$, Sb(III)(TMS)$_3$, Te(II)(TMS)$_2$, or Te(IV)(TMS)$_4$. Such metal silyl compounds are commercially available from numerous sources, such as Air Products and Chemicals, Inc. (Allentown, Pa.), or may be synthesized by conventional techniques.

By way of example, the reactive metal precursor used in the ALD layer cycle may be the metal halide and the co-reactive metal precursor may be the metal silyl compound. Alternatively, the reactive metal precursor used in the ALD layer cycle may be the metal alkoxide and the co-reactive metal precursor may be the metal silyl compound.

The GeSbTe material may be formed on the substrate by an ALD process utilizing the reactive metal precursors and the co-reactive metal precursors. As used herein, the term "substrate" refers to a conventional silicon substrate or other bulk substrate having a layer of semiconductor material. As used herein, the term "bulk substrate" includes not only silicon wafers, but also silicon-on-insulator ("SOT") substrates, silicon-on-sapphire ("SOS") substrates, epitaxial layers of silicon on a base semiconductor foundation, and other semiconductor, or optoelectronics materials, such as silicon-germanium, germanium, gallium arsenide, or indium phosphide. The substrate may include materials thereon, such as dielectric or conductive materials present from a previous manufacturing act. By way of example, the substrate may be an intermediate structure produced during the fabrication of a PCRAM device. While the materials described and illustrated herein may be formed as layers, the materials are not limited thereto and may be formed in other three-dimensional configurations.

If the metal precursors used in the ALD process are solids or liquids at room temperature, the metal precursors may be volatilized before introduction into an ALD deposition chamber or reactor. ALD deposition chambers are known in the art and, therefore, are not described in detail herein. Solid metal precursors may be dissolved or suspended in an appropriate solvent before use in the ALD process. Liquid metal precursors may be used neat or combined with an appropriate solvent before use in the ALD process. Each of the metal precursors may be sequentially delivered to the ALD deposition chamber by conventional techniques dependent on the phase characteristics of the respective metal precursor, the desired flow rate, or the processing temperature. The technique for delivery of the metal precursors may be determined by a person of ordinary skill in the art and, therefore, is not described in detail herein. By way of example, the metal precursors may be introduced into the ALD deposition chamber by vapor draw or direct liquid injection. The metal precursors may be delivered to the ALD reaction chamber by a carrier gas, such as nitrogen, helium, argon, hydrogen, or combinations thereof.

The substrate may be placed in the ALD deposition chamber and sequentially exposed to the reactive and co-reactive germanium precursors, the reactive and co-reactive antimony precursors, or the reactive and co-reactive tellurium precursors to produce monolayers of germanium, antimony, and tellurium, respectively. By way of example, the substrate may be placed in the ALD deposition chamber and subsequently exposed to one cycle of the germanium chloride precursor. The ALD deposition chamber may then be purged and the substrate exposed to the $Te(TMS)_2$ precursor. The ALD deposition chamber may then be purged. The substrate may then be exposed to one cycle of the antimony alkoxide precursor. The ALD deposition chamber may then be purged and the substrate exposed to the $Te(TMS)_2$ precursor, yielding a GeSbTe material having a Ge:Sb:Te ratio of 2:2:5. If a higher tellurium content is desired, the substrate may be exposed to tellurium(IV) ethoxide, followed by exposure to $Te(TMS)_2$. The tellurium content may be adjusted by varying the number of GeSbTe ALD layer cycles to the number to Te ALD layer cycles. The ALD deposition chamber may then be purged. The substrate may be exposed for an amount of time sufficient for the metal precursors to saturate the surface of the substrate. The ALD deposition chamber may be fully purged between cycles in order to prevent a CVD-like reaction. ALD layer cycles to produce the monolayers of germanium, antimony, and tellurium may be repeated until a desired thickness of the GeSbTe material is achieved. The number of ALD layer cycles may also be repeated to provide the GeSbTe material having the desired stoichiometry, as explained in more detail below. The GeSbTe material produced by the method of the present invention is not limited to alternating single layers of each material. Rather, the GeSbTe material may also include several layers of one metal (formed by conducting several ALD layer cycles of the particular metal) alternating with a single layer of a second metal or third metal (formed by conducting a single ALD layer cycle of the second or third metal), to obtain a desired stoichiometry of the GeSbTe material.

The reactive metal precursor and the co-reactive metal precursor of a particular metal may be separately introduced into the ALD reaction chamber containing the substrate. The reactive metal precursor and the co-reactive metal precursor may be introduced into the ALD reaction chamber at a flow rate of from approximately 5 standard cubic centimeters per minute (sccm) to approximately 500 sccm. The reactive metal precursor may react with surface groups on the substrate to form a partial monolayer of the metal on the substrate. The substrate may be exposed to the reactive metal precursor (i.e., metal alkoxide or metal halide) for an amount of time sufficient for the reactive metal precursor to react with the substrate. The exposure time may range from approximately 0.1 second to approximately 30 seconds. The ALD reaction chamber may then be purged with an inert gas, such as argon or nitrogen, to remove excess reactive metal precursor and reaction byproducts. The purge time may range from approximately 0.1 second to approximately 60 seconds. The co-reactive metal precursor may be introduced into the ALD reaction chamber and reacted with the hydroxyl or halide groups on the substrate and with portions of the partial monolayer of the metal that include remaining ligands from the reactive metal precursor to form additional metal. The alkoxide groups or halogen groups of the reactive metal precursor are nucleophilic substituents that may react with the silyl group of the co-reactive metal precursor by a ligand exchange reaction to form the layer of the metal on the substrate. The exposure time may range from approximately 0.1 second to approximately 30 seconds. The metal from the reactive metal precursor and the co-reactive metal precursor, in combination, may form the monolayer of the metal on the substrate during the ALD layer cycle. The ALD reaction chamber may then be purged with the inert gas before introducing the reactive and co-reactive metal precursors having a different metal to conduct additional ALD layer cycles. The purge time may range from approximately 0.1 second to approximately 60 seconds. Each ALD layer cycle may deposit from approximately 0.25 Å to approximately 2.0 Å per cycle. During each ALD layer cycle, the ALD deposition chamber may be maintained at a temperature of from approximately room temperature to approximately 150° C. In contrast, conventional ALD processes are conducted at a temperature of from approximately 180° C. to approximately 300° C. The ALD layer cycles may be repeated until the GeSbTe material is of a desired thickness and stoichiometry.

By way of example, to form a germanium layer by ALD, the reactive germanium precursor (i.e., $Ge(OEt)_4$) and the co-reactive germanium precursor (i.e., $GeH(IV)(TMS)_3$) may be sequentially introduced into the ALD reaction chamber and exposed to the substrate. The reactive germanium precursor may be introduced into the ALD reaction chamber and reacted with the substrate to form a partial germanium monolayer, the ALD reaction chamber purged to remove excess reactive germanium precursor and byproducts, the co-reactive germanium precursor introduced into the ALD reaction chamber and reacted with the substrate, and the ALD reaction chamber purged to remove excess co-reactive germanium precursor and byproducts. The reactive germanium precursor and the co-reactive germanium precursor may each be pulsed into the ALD reaction chamber for an amount of time sufficient for the reactive germanium precursor and the co-reactive germanium precursor to be chemisorbed or adsorbed to the substrate, resulting in the formation of the germanium layer. During formation of the germanium layer, the ALD reaction chamber may be maintained at a temperature of between approximately 20° C. and approximately 150° C.

To form an antimony layer by ALD, the reactive antimony precursor (i.e., $Sb(OEt)_3$) and the co-reactive antimony precursor (i.e., $Sb(III)(TMS)_3$) may be separately introduced into the ALD reaction chamber and exposed to the germanium layer on the substrate. The reactive antimony precursor may react with ligands of the reactive germanium precursor and the co-reactive germanium precursor to form a partial antimony monolayer over the germanium layer. The co-reactive antimony precursor may react with ligands of the reactive germanium precursor and the co-reactive germanium precursor to form the antimony layer over the germanium layer. The reactive antimony precursor and the co-reactive antimony precursor may be sequentially pulsed into the ALD reaction chamber for an amount of time sufficient for the reactive antimony precursor and the co-reactive antimony precursor to be chemisorbed or adsorbed to the germanium monolayer, resulting in the formation of the antimony monolayer. Between pulses of the reactive antimony precursor and the co-reactive antimony precursor, the ALD reaction chamber may be purged with the inert gas to remove excess reactive antimony precursor, co-reactive antimony precursor, and byproducts.

To form a tellurium layer by ALD, the reactive tellurium precursor (i.e., $Te(OEt)_4$) and the co-reactive tellurium precursor (i.e., $Te(TMS)_2$) may be separately introduced into the ALD reaction chamber and exposed to the antimony layer. The reactive tellurium precursor may react with ligands of the reactive antimony precursor and the co-reactive antimony precursor to form a partial tellurium monolayer over the antimony layer. The co-reactive tellurium precursor may react with ligands of the reactive antimony precursor and the co-reactive antimony precursor to form the tellurium layer over the antimony layer. The reactive tellurium precursor and the co-reactive tellurium precursor may be sequentially pulsed into the ALD reaction chamber for an amount of time sufficient for the reactive tellurium precursor and the co-reactive tellurium precursor to be chemisorbed or adsorbed to the antimony layer, resulting in the formation of the tellurium layer. Between pulses of the reactive tellurium precursor and the co-reactive tellurium precursor, the ALD reaction chamber may be purged with the inert gas to remove excess reactive tellurium precursor, co-reactive tellurium precursor, and byproducts.

Since the ALD layer cycles for forming the metal layers include reactive and co-reactive metal precursors, the metal layers may be formed without co-reactants, such as water, oxygen, hydrogen, or ammonia. Each of the ALD layer cycles may include the metal precursors, the carrier gas, and the purge gas, with no other reactants.

In one embodiment, the reactive germanium precursor is $Ge(II)Cl_2$ and the co-reactive metal precursor is $GeH(IV)(TMS)_3$. When these germanium precursors are reacted in the ALD reaction chamber, the layer of germanium is formed on the substrate. In one embodiment, the reactive antimony precursor is $Sb(III)(OEt)_3$ and the co-reactive antimony precursor is $Sb(III)(TMS)_3$, which react to form the layer of antimony on the layer of germanium. In another embodiment, the reactive metal precursor is $Sb(III)Cl_3$ and the co-reactive metal precursor is $Sb(III)(TMS)_3$, which react to form the layer of antimony on the germanium layer. In another embodiment, the reactive metal precursor is $Te(OEt)_4$ and the co-reactive metal precursor is $Te(II)(TMS)_2$, which react to form the layer of tellurium on the antimony layer. In another embodiment, the reactive metal precursor is $Te(OMe)_4$ and the co-reactive metal precursor is $Te(II)(TMS)_2$, which react to form the layer of tellurium on the antimony layer.

While the ALD process described above includes forming the germanium layer, the antimony layer, and the tellurium layer, the metal monolayers may be formed in any order so long as the tellurium layer is not deposited directly on the substrate because $Te(II)(TMS)_2$ may poison the substrate.

The ALD layer cycles described above may be repeated to form the GeSbTe material having the desired stoichiometry. By adjusting the number of the ALD layer cycles, the GeSbTe material having the desired stoichiometry may be formed. By way of example, one germanium ALD layer cycle (using $Ge(II)Cl_2$ and $GeH(IV)(TMS)_3$ as the germanium precursors), one antimony ALD layer cycle (using $Sb(III)(OEt)_3$ and $Sb(III)(TMS)_3$ as the antimony precursors), and three tellurium ALD layer cycles (using $Te(OEt)_4$ and $Te(II)(TMS)_2$ as the tellurium precursors) may be conducted to form $GeSbTe_3$. By adjusting the number of ALD layer cycles conducted of a particular metal, the composition of the GeSbTe material may be altered. In another example, two cycles of the germanium ALD layer cycle may be conducted with two cycles of the antimony ALD layer cycle and three cycles of the tellurium ALD layer cycle to form $Ge_2Sb_2Te_3$. After conducting the desired number of ALD layer cycles to form the desired number of layers of germanium, antimony, and tellurium to achieve the desired thickness of the GeSbTe material, the GeSbTe material may be annealed.

In yet another example, to form $GeSb_4Te_7$, germanium layers may be formed by reacting the reactive germanium precursor ($GeCl_4$) and the co-reactive germanium precursor ($GeH(TMS)_3$) as described above, antimony layers may be formed by reacting the reactive antimony precursor ($SbCl_3$) and the co-reactive antimony precursor ($Sb(III)(TMS)_3$) as described above, and tellurium layers may be formed by reacting the reactive tellurium precursor ($Te(OEt)_4$) and the co-reactive tellurium precursor ($Te(II)(TMS)_2$) as described above. The germanium and tellurium layers may form GeTe and the antimony and tellurium layers may form $Sb_2Te_3$. If one GeTe ALD cycle and two $Sb_2Te_3$ ALD cycles are conducted, $GeSb_4Te_7$ ($GeTe+Sb_4Te_6$) may be formed. If one GeTe ALD cycle and three $Sb_2Te_3$ ALD cycles are conducted, $GeSb_6Te_{10}$ ($GeTe+Sb_6Te_9$) may be formed. If two GeTe ALD cycles and one $Sb_2Te_3$ ALD cycle are conducted, $Ge_2Sb_2Te_5$ ($Ge_2Te_2+Sb_2Te_3$) may be formed. If two GeTe ALD cycles and two $Sb_2Te_3$ ALD cycles are conducted, $GeSb_2Te_4$ may be formed. If two GeTe ALD cycles and three $Sb_2Te_3$ ALD cycles are conducted, $Ge_2Sb_6Te_{11}$ ($Ge_2Te_2+Sb_6Te_9$) may be formed. Therefore, simply by adjusting the number of ALD cycles, GeSbTe materials of desired stoichiometries may be formed.

By utilizing the method of the present disclosure, GeSbTe materials having compositions off the Ge—Te and $Sb_2Te_3$ tie-line may be produced. The method of the present invention may also be utilized to produce GeSbTe materials on the tie-line. Since the relative amounts of the Ge, Sb, and Te present in the GeSbTe material may be altered, the melting point, glass transition temperature, crystallization speed, or data retention rate of the GeSbTe may be tailored as desired.

The illustrations presented herein are not meant to be actual views of any particular intermediate structure or PCRAM device, but are merely idealized representations which are employed to describe the present invention. The figures are not necessarily drawn to scale. Additionally, elements common between figures may retain the same numerical designation.

Since the method of the present invention utilizes an ALD process to form the GeSbTe material, the method may be used to deposit the GeSbTe material in small openings in the substrate, such as in small openings in which CVD is not suitable. By way of example, the openings in the substrate may have a width of less than approximately 100 nm. As shown in FIG. 1, the GeSbTe material 2 may be deposited in the openings 4 in the substrate 6. The GeSbTe material 2 in the openings 4 may be highly conformal and have uniformity of chemical composition.

Figure 2:
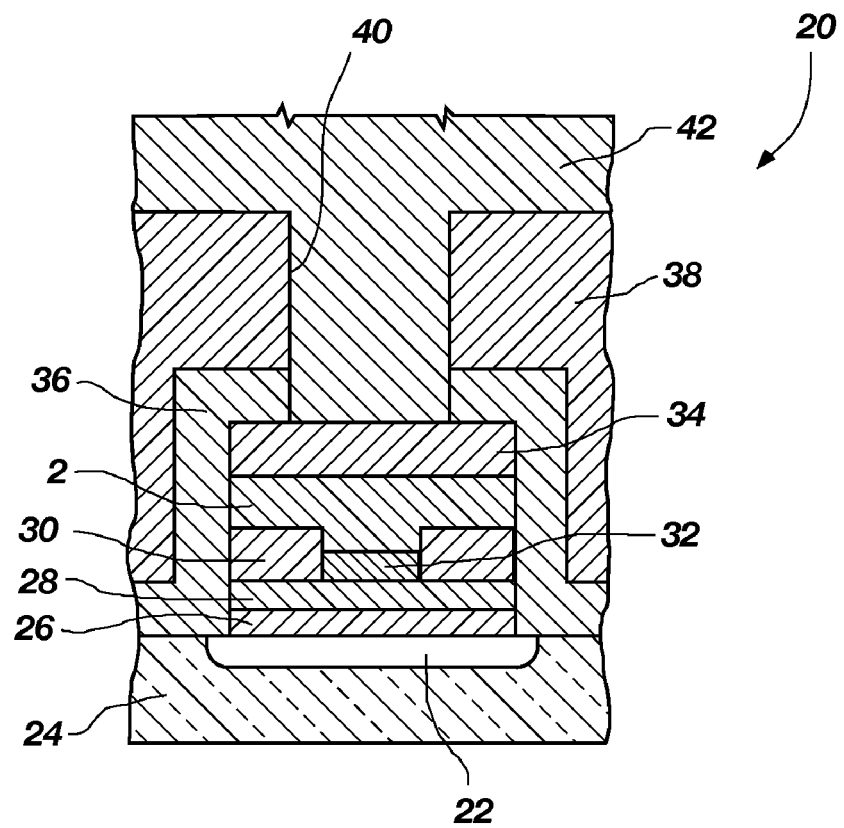
FIG. 2 is a cross-sectional view of a phase change random access memory ("PCRAM") device including the GeSbTe material formed in accordance with an embodiment of the present invention.

The method of the present invention may be utilized to produce PCRAM devices that include the GeSbTe material. The GeSbTe material 2 may be used in a PCRAM device 20, as illustrated in FIG. 2. While FIG. 2 illustrates one embodiment of a PCRAM device 20, the GeSbTe material 2 may be utilized in other PCRAM structures or in a complementary metal-oxide semiconductor ("CMOS") device. The PCRAM device 20 includes a memory matrix or array (not shown) that includes a plurality of memory cells for storing data. The memory matrix is coupled to periphery circuitry (not shown) by a plurality of control lines. The periphery circuitry may include circuitry for addressing the memory cells contained within the memory matrix, along with circuitry for storing data in and retrieving data from the memory cells. The periphery circuitry may also include other circuitry used for controlling or otherwise ensuring the proper functioning of the PCRAM device 20.

The memory matrix includes a plurality of memory cells that may be arranged in generally perpendicular rows and columns, although other arrangements are contemplated. The memory cells in each row are coupled together by a respective access line, for example a wordline (not shown), and the memory cells in each column are coupled together by a respective data/sense line, for example a digit line 22. Each memory cell includes a wordline node that is coupled to a respective wordline, and each memory cell includes a digit line node that is coupled to a respective digit line 22. The wordlines and digit lines 22 are collectively referred to as address lines. These address lines are electrically coupled to the periphery circuitry so that each of the memory cells can be accessed for the storage and retrieval of information. The memory cell includes a memory element, such as a programmable resistive element, which is coupled to an access device (not shown), such as a diode. The memory element is formed from the GeSbTe material 2. The diode may be a conventional diode, a zener diode, or an avalanche diode, depending upon whether the diode array of the memory matrix is operated in a forward biased mode or a reverse biased mode. The memory element is coupled to the wordline, and the access device is coupled to the digit line 22. However, connections of the memory element may be reversed without adversely affecting the operation of the memory matrix.

As shown in FIG. 2, the PCRAM device 20 includes substrate 24, digit line 22, n-doped polysilicon material 26, p-doped polysilicon material 28, dielectric material 30, lower electrode 32, GeSbTe material 2, upper electrode 34, insulative material 36, oxide material 38, and contact hole 40 (filled with conductive material 42). The PCRAM device 20 may be formed by conventional techniques, which are not described in detail herein. The digit lines 22 may be formed in or on the substrate 24. By way of non-limiting example, the digit line 22 may formed in the substrate 24 as a doped $N^+$ type trench. An access device (not shown) may be formed on top of the digit line 22. The access device may be a diode, or other device, formed by the n-doped polysilicon material 26 and the p-doped polysilicon material 28. Next, the dielectric material 30 may be formed on top of the p-doped polysilicon material 28. The dielectric material 30 may be formed from a suitable insulative or dielectric material, such as plasma enhanced CVD ("PECVD") silicon oxide ($SiO_x$), where x is 1 or 2, PECVD silicon nitride ($Si_3N_4$), or standard thermal CVD $Si_3N_4$.

The lower electrode 32 may be formed using collimated PVD or another suitable directional deposition technique such that the lower electrode 32 is formed on top of the p-doped polysilicon material 28. The lower electrode 32 may be formed from at least one material, and may be formed in at least one layer or other three-dimensional configuration. For instance, a carbon material may be used as a barrier material to prevent unwanted migration between the subsequently deposited GeSbTe material 2 and the p-doped polysilicon material 28. Titanium nitride (TiN) may then be deposited upon the carbon material to complete the formation of the lower electrode 32. Additional materials that may be used to form the lower electrode 32 include, but are not limited to, titanium aluminum nitride (TiAlN) or tungsten (W).

The GeSbTe material 2 may be deposited so that the GeSbTe material 2 contacts the lower electrode 32. A thickness at which the GeSbTe material 2 is deposited may depend on the size of the lower electrode 32. By way of non-limiting example, if the lower electrode 32 is circular and has a diameter of approximately 40 nm, the GeSbTe material 2 may be deposited at a thickness of from approximately 400 Å to approximately 2000 Å. The GeSbTe material 2 may be a substantially homogeneous material. The upper electrode 34 may be deposited on top of the GeSbTe material 2. The upper electrode 34 may be formed from TiN or other suitable material. After the upper electrode 34, the GeSbTe material 2, the dielectric material 30, and the access device have been patterned and etched to form an individual memory cell, the insulative material 36, such as silicon nitride, may be deposited over the structure. The oxide material 38 may then be deposited over the insulative material 36. The oxide material 38 may be patterned and the contact hole 40 formed through the oxide material 38 and the insulative material 36. The contact hole 40 may then be filled with the conductive material 42 to form a wordline and produce the PCRAM device 20 shown in FIG. 2.

While the methods of the present invention have been used herein to describe the formation of GeSbTe materials, other chalcogenide phase change materials, such as indium-antimony-tellurium materials, may be formed in a similar manner by selecting appropriate indium precursors, such as a reactive indium precursor (i.e., an indium silyl precursor) and a co-reactive indium precursor (i.e., an indium halide precursor). Additionally, binary chalcogenide materials, such as copper-tellurium or germanium-sulfur may be formed in a similar manner.

CONCLUSION

In one embodiment, the present invention includes a method of forming a GeSbTe material that comprises conducting an ALD layer cycle of a first metal, the ALD layer cycle comprising a reactive first metal precursor and a co-reactive first metal precursor. An ALD layer cycle of a second metal is then conducted, the ALD layer cycle comprising a reactive second metal precursor and a co-reactive second metal precursor. An ALD layer cycle of a third metal is then conducted, the ALD layer cycle comprising a reactive third metal precursor and a co-reactive third metal precursor. The ALD layer cycle of the first metal, the ALD layer cycle of the second metal, and the ALD layer cycle of the third metal are then repeated to form a GeSbTe material having a desired stoichiometry.

In another embodiment, the present invention includes a method of forming a GeSbTe material that comprises forming a plurality of germanium layers, antimony layers, and tellurium layers on a substrate located in an ALD reaction chamber. A germanium layer of the plurality of germanium layers is formed by introducing a reactive germanium precursor and a co-reactive germanium precursor to the ALD reaction chamber. The reactive germanium precursor and the co-reactive germanium precursor are combined to form the germanium layer. An antimony layer of the plurality of antimony layers is formed by introducing a reactive antimony precursor and a co-reactive antimony precursor to the ALD reaction chamber. The reactive antimony precursor and the co-reactive antimony precursor are combined to form the antimony layer. A tellurium layer of the plurality of tellurium layers is formed by introducing a reactive tellurium precursor and a co-reactive tellurium precursor to the ALD reaction chamber. The reactive tellurium precursor and the co-reactive tellurium precursor are combined to form the tellurium layer. The formation of the plurality of germanium layers, antimony layers, and tellurium layers is repeated to form a GeSbTe material having a desired stoichiometry.

In an additional embodiment, the present invention includes a method of forming a semiconductor device structure that comprises forming a plurality of openings in a substrate and forming a GeSbTe material by ALD in the plurality of openings. The openings have a width of less than approximately 100 nm.

While the invention is susceptible to various modifications and alternative forms, specific embodiments have been shown by way of example in the drawings and have been described in detail herein. However, the invention is not intended to be limited to the particular forms disclosed. Rather, the invention is to cover all modifications, equivalents, and alternatives falling within the scope of the invention as defined by the following appended claims and their legal equivalents.

What is claimed is:

1. A method of forming a germanium-antimony-tellurium material, comprising:
   forming a plurality of germanium layers, antimony layers, and tellurium monolayers on a substrate located in an atomic layer deposition (ALD) reaction chamber, wherein:
      forming a germanium layer of the plurality of germanium layers comprises:
         introducing a reactive germanium precursor and a co-reactive germanium precursor to the ALD reaction chamber; and
         combining the reactive germanium precursor and the co-reactive germanium precursor to form the germanium layer;
      forming an antimony layer of the plurality of antimony layers comprises:
         introducing a reactive antimony precursor and a co-reactive antimony precursor to the ALD reaction chamber; and
         combining the reactive antimony precursor and the co-reactive antimony precursor to form the antimony layer; and
      forming a tellurium layer of the plurality of tellurium layers comprises:
         introducing a reactive tellurium precursor and a co-reactive tellurium precursor to the ALD reaction chamber; and
         combining the reactive tellurium precursor and the co-reactive tellurium precursor to form the tellurium layer; and
   repeating the formation of the plurality of germanium layers, antimony layers, and tellurium layers to form a germanium-antimony-tellurium material having a desired stoichiometry.

2. The method of claim 1, wherein introducing a reactive germanium precursor and a co-reactive germanium precursor to the ALD reaction chamber comprises introducing the reactive germanium precursor comprising a germanium halide compound or a germanium alkoxide compound to the ALD reaction chamber.

3. The method of claim 1, wherein introducing a reactive germanium precursor and a co-reactive germanium precursor to the ALD reaction chamber comprises introducing the reactive germanium precursor selected from the group consisting of $Ge(II)F_2$, $Ge(IV)F_4$, $Ge(II)Cl_2$, $Ge(IV)Cl_4$, $Ge(II)Br_2$, $Ge(IV)Br_4$, $Ge(II)I_2$, $Ge(IV)I_4$, $Ge(IV)(OMe)_4$, and $Ge(IV)(OEt)_4$ to the ALD reaction chamber.

4. The method of claim 1, wherein introducing a reactive germanium precursor and a co-reactive germanium precursor to the ALD reaction chamber comprises introducing the co-reactive germanium precursor comprising a germanium silyl compound to the ALD reaction chamber.

5. The method of claim 1, wherein introducing a reactive germanium precursor and a co-reactive germanium precursor to the ALD reaction chamber comprises introducing the co-reactive germanium precursor selected from the group consisting of $Ge(II)(trimethylsilyl)_2$, $Ge(IV)(trimethylsilyl)_4$, and $GeH(trimethylsilyl)_3$, to the ALD reaction chamber.

6. The method of claim 1, wherein combining the reactive germanium precursor and the co-reactive germanium precursor to form the germanium layer comprises combining the reactive germanium precursor and the co-reactive germanium precursor in the absence of a co-reactant.

7. The method of claim 1, wherein introducing a reactive antimony precursor and a co-reactive antimony precursor to the ALD reaction chamber comprises introducing the reactive antimony precursor comprising an antimony halide compound or an antimony alkoxide compound to the ALD reaction chamber.

8. The method of claim 1, wherein introducing a reactive antimony precursor and a co-reactive antimony precursor to the ALD reaction chamber comprises introducing the reactive antimony precursor selected from the group consisting of $Sb(V)F_5$, $Sb(III)F_3$, $Sb(III)Cl_3$, $Sb(V)Cl_5$, $Sb(III)I_3$, $Sb(III)Br_3$, $Sb(III)(OMe)_3$, and $Sb(III)(OEt)_3$ to the ALD reaction chamber.

9. The method of claim 1, wherein introducing a reactive antimony precursor and a co-reactive antimony precursor to the ALD reaction chamber comprises introducing the co-reactive antimony precursor comprising an antimony silyl compound to the ALD reaction chamber.

10. The method of claim 1, wherein introducing a reactive antimony precursor and a co-reactive antimony precursor to the ALD reaction chamber comprises introducing the co-reactive antimony precursor comprising $Sb(III)(trimethylsilyl)_3$ to the ALD reaction chamber.

11. The method of claim 1, wherein combining the reactive antimony precursor and the co-reactive antimony precursor to form the antimony layer comprises combining the reactive antimony precursor and the co-reactive antimony precursor in the absence of a co-reactant.

12. The method of claim 1, wherein introducing a reactive tellurium precursor and a co-reactive tellurium precursor to the ALD reaction chamber comprises introducing the reactive tellurium precursor comprising a tellurium halide compound or a tellurium alkoxide compound to the ALD reaction chamber.

13. The method of claim 1, wherein introducing a reactive tellurium precursor and a co-reactive tellurium precursor to the ALD reaction chamber comprises introducing the reactive tellurium precursor selected from the group consisting of $TeCl_4$, $TeBr_4$, $TeI_4$, $Te(IV)(OMe)_4$, and $Te(IV)(OEt)_4$ to the ALD reaction chamber.

14. The method of claim 1, wherein introducing a reactive tellurium precursor and a co-reactive tellurium precursor to the ALD reaction chamber comprises introducing the co-reactive tellurium precursor comprising a tellurium silyl compound to the ALD reaction chamber.

15. The method of claim 1, wherein introducing a reactive tellurium precursor and a co-reactive tellurium precursor to the ALD reaction chamber comprises introducing the co-reactive tellurium precursor selected from the group consisting of $Te(II)(trimethylsilyl)_2$ or $Te(IV)(trimethylsilyl)_4$ to the ALD reaction chamber.

16. The method of claim 1, wherein combining the reactive tellurium precursor and the co-reactive tellurium precursor to form the tellurium layer comprises combining the reactive tellurium precursor and the co-reactive tellurium precursor in the absence of a co-reactant.

17. A method of forming a semiconductor device structure, comprising:
   forming a plurality of openings in a substrate, the plurality of openings having a width of less than approximately 100 nm; and
   forming a germanium-antimony-tellurium material by atomic layer deposition (ALD) in the plurality of openings, wherein forming the germanium-antimony-tellurium material by atomic layer deposition (ALD) in the plurality of openings comprises:
      conducting an ALD layer cycle of a first metal, the ALD layer cycle comprising a reactive first metal precursor and a co-reactive first metal precursor;
      conducting an ALD layer cycle of a second metal, the ALD layer cycle comprising a reactive first metal precursor and a co-reactive second metal precursor;
      conducting an ALD layer cycle of a third metal, the ALD layer cycle comprising a reactive first metal precursor and a co-reactive third metal precursor; and
      repeating the ALD layer cycle of the first metal, the ALD layer cycle of the second metal, and the ALD layer cycle of the third metal to form a germanium-antimony-tellurium material having a desired stoichiometry.

18. The method of claim 17, wherein forming a germanium-antimony-tellurium material by atomic layer deposition (ALD) in the plurality of openings comprises conformally depositing the germanium-antimony-tellurium material in the plurality of openings.

* * * * *